(12) United States Patent
Asamura

(10) Patent No.: US 6,475,853 B2
(45) Date of Patent: Nov. 5, 2002

(54) STACKED SEMICONDUCTOR INTEGRATED CIRCUIT DEVICE AND MANUFACTURING METHOD THEREOF

(75) Inventor: Takeshi Asamura, Kanagawa-ken (JP)

(73) Assignee: Kabushiki Kaisha Toshiba, Kawasaki (JP)

(*) Notice: Subject to any disclaimer, the term of this patent is extended or adjusted under 35 U.S.C. 154(b) by 0 days.

(21) Appl. No.: 09/813,807

(22) Filed: Mar. 22, 2001

(65) Prior Publication Data

US 2001/0019162 A1 Sep. 6, 2001

Related U.S. Application Data

(62) Division of application No. 09/052,065, filed on Mar. 10, 1998.

(30) Foreign Application Priority Data

Apr. 2, 1997 (JP) .............................. 9-083461

(51) Int. Cl.⁷ ......................................... H01L 21/8238
(52) U.S. Cl. ........................ 438/225; 438/230; 438/299; 438/303
(58) Field of Search ................................ 438/223, 229, 438/260, 261, 299, 301, 303, 305, 306

(56) References Cited

U.S. PATENT DOCUMENTS

| | | | |
|---|---|---|---|
| 5,250,835 A | 10/1993 | Izawa | 257/408 |
| 5,449,631 A * | 9/1995 | Giewont et al. | 438/303 |
| 5,565,383 A * | 10/1996 | Sakai | 204/192.17 |
| 5,597,751 A * | 1/1997 | Wang | 438/261 |
| 5,702,972 A * | 12/1997 | Tsai et al. | 438/305 |
| 5,811,853 A | 9/1998 | Wang | 257/316 |
| 5,962,897 A | 10/1999 | Takemura et al. | 257/347 |

FOREIGN PATENT DOCUMENTS

JP 5-308129 11/1993

* cited by examiner

Primary Examiner—Kevin M. Picardat
(74) Attorney, Agent, or Firm—Finnegan, Henderson, Farabow, Garrett & Dunner, L.L.P.

(57) ABSTRACT

The present invention provides a semiconductor integrated circuit having excellent junction characteristics when applying the silicide technology to an extremely narrowed diffusion layer between adjacent gate electrodes as well as a method for manufacturing the same. To attain this object, a configuration of the invention has electrode layers formed on a semiconductor substrate, sidewall layers formed on the side walls of electrode layers, and high-melting point metal silicide layers formed on the electrode layers, wherein the sidewall layers are connected together. This makes it possible to eliminate abnormal growth during silicide formation because of the fact that the region defined between the electrode layers on the substrate is covered by the sidewall layers.

17 Claims, 19 Drawing Sheets

STACKED SEMICONDUCTOR INTEGRATED CIRCUIT DEVICE AND MANUFACTURING METHOD THEREOF

This is a division of application Ser. No. 09/052,065, filed Mar. 31, 1998 which is incorporated herein by reference.

FIELD OF THE INVENTION

The present invention relates generally to semiconductor integrated circuits having a decreased electrode-to-electrode distance and a manufacturing method thereof More particularly, but not exclusively, the invention relates to metal oxide semiconductor (MOS) transistors having the structure of narrowed gate electrode distance with the capability of eliminating the flow of leak current in a difffusion layer region between adjacent gate electrodes while increasing the operating speed of semiconductor integrated circuits.

BACKGROUND OF THE INVENTION

Recent advances of micropatterning/microfabrication technology in the manufacture of semiconductor elements have enabled attainment of higher integration of an increased number of devices on one chip, while simultaneously supporting the fundamental technical basis for development of high-performance devices.

One approach to meet the needs is to further increase the integration density of currently available stacked metal oxide semiconductor (MOS) transistors. The term "stacked MOS transistors" as used herein may refer to those transistors with the device structure having a plurality of gate electrodes extending in parallel in the direction of the gate length. By way of example, since MOS transistors are such that the "nature" of transistors (gate current) is determinable depending upon the ratio of gate width to gate length, it is possible to generate a required gate current which increases in magnitude as the gate width increases. Forming a plurality of gate electrodes of a constant gate width in a diffusion layer region of limited dimension may enable formation of plural MOS transistors. More specifically, forming two parallel gate electrodes having the same gate width on a substrate surface corresponding to such difflusion layer region makes it possible to configure circuitry including a combination of two MOS transistors.

FIG. 1 illustrates a plan view of one typical prior known NAND circuit comprised of a p-type MOS (pMOS) transistors and a n-type MOS (nMOS) transistor. As shown, the NAND circuit includes an n-type diffusion layer 223 and a p-type diffuision layer 224, above which gate electrodes 207 and 209 are formed. The diffusion layers 223, 224 have electrodes 227, 233 which are electrically connected together by metal lead patterns 235. Due to the inherent structure of the cubit, the distance "A" between the gate electrodes of nMOS transistors is less than the distance "B" between the gate electrodes of nMOS transistors. The gate distance "A" may typically be 300 nanometers (nm). The planar structure of one NMOS transistor and its operation will be described with reference to FIG. 2.

FIG. 2 is a plan view of one of the NMOS transistors constituting the NAND circuit with two gate electrodes formed insulatively overlying its diffusion layer. For example, the n-type diffusion layer 223 is formed in a semiconductor substrate, while parallel elongated gate electrodes 207, 209 are formed over the diffusion layer 223, wherein the gate electrode 207 is spaced apart from gate electrode 209 by a predefined distance that measures approximately 300 nm.

This prior art nMOS (part of the NAND circuit) transistor only generates a drain current when a voltage is applied to the electrodes 229, 231. In this case, a diffusion layer 223a may function as the source region, diffiision layer 223b serves as the drain region, and gate electrode 207 and 209 acts as the gate electrode, thus constituting a transistor which permits flow of a drain current from the source region 223a toward drain region 223b. Having two gate electrode (each gate width is thin) on one diffusion layer reduces the resistivity of the gate electrode. That increases the operation speed of the NMOS transistor.

FIGS. 3 through 6 which illustrate, in cross-section as taken on line A—A' of FIG. 2, some of the major steps in the manufacture of the FIG. 2 MOS transistor in a time sequential order.

First, as shown in FIG. 3, a semiconductor substrate 201 made typically of silicon is prepared, which is then doped by well-known ion implantation techniques with a p-type impurity to a concentration of $4\times10^{16}$ atoms per cubic centimeter (4E16 cm$^{-3}$), forming a p-type well region 202 in the silicon substrate 201. An element separation region 203 is formed by selective oxidation techniques; then, a gate oxide film 205, of typically 6 nm thick, is formed by thermal oxidation on the p-well region 202 and element separation region 203. Next, a non-doped polycrystaline silicon (poly-silicon) layer having a thickness of approximately 200 nm is formed by chemical vapor deposition (CVD) techniques. The resulting polysilicon layer is then etched forming electrodes 207, 209. At this time, these electrodes 207, 209 are spaced apart from each other by about 300 nm, or more or less. Thereafter, an oxide film 206 is formed by low-pressure CVD (LPCVD) techniques on the gate oxide film 205 and electrodes 207, 209 as well as element separation region 203, to a thickness of for example 20 nm. Then, the p-well region 202 is doped by ion implantation with a chosen impurity such as arsenide through oxide film 206 at a dose of $3\times10^{14}$ atoms per square centimeter (3E14 l/cm$^2$) while applying thereto an acceleration voltage of 60 kilo-electronvolts reV), and is then thermally annealed for activation of the dopant at 950° C. for 30 seconds to thereby form a "shallow" diffusion layer 211 (depth of 80 nm from the substrate surface) having "the extension structure" of a sheet resistance of about 250 ohms per unit area ($\Omega/\square$) as depicted in FIG. 3.

Next, as shown in FIG. 4, a silicon nitride film 217 is deposited by LPCVD to a thickness of typically 100 nm, overlying the entire top surface of the semiconductor substrate. When this is done, a "gap" space defined between the neighboring electrodes 207 and 209 is not completely burred and defines a narrow recess portion or "grove" therebetween due to the fact that the distance between these electrodes 207, 209 is 300 nm.

Thereafter, as shown in FIG. 5, the silicon nitride film 217 is subjected to anisotropic etching with the oxide film 206 being used as a stopper for removal of the entire upper 100 nm part of film 217; the etching is terminated when the stopper film 206 is exposed at its top surface. At this time any silicon nitride deposited on the side walls of electrodes 207 and 209 still resides thereon, forming respective sidewall films 219 that are approximately 100 nm in maximal thickness. Next, with the sidewall films 219 used as a mask, the p-well region 202 is doped by ion implantation with a chosen impurity such as arsenide at an acceleration voltage of 65 keV to a dose of 5E15 (l/cm$^2$), and is then annealed at 1050° C. for about 10 seconds, thus forming a "deep" diffusion layer 223 (its depth from the substrate surface is typically 150 nm, and its sheet resistance may be 60 ($\Omega/\square$) as shown in FIG. 5.

Here, for a decrease in surface resistivity of the electrodes 207, 209 and diffusion layer 223 to speed up the operation of MOS transistors, one or more low-resistance silicides are formed near the electrodes by use of the salicide process, which will be explained as follows. First, the oxide film 206 is removed away using hydrofluoric acid solution with the sidewall films 219 used as a mask, exposing electrodes 207, 209 and diffusion 223. Then, titanium is entirely deposited by sputtering techniques on the exposed surface to a thickness of 30 nm or therearound, for formation of relatively high resistive silicides by a first-step annealing process at 750° C. for 30 seconds. During this process the titanium exhibits silicide reaction only with silicon residing in such exposed region while allowing titanium in the other part thereof to be kept unreacted. Such unreacted titanium is then selectively removed using a 1:1 mixed solution of sulfuric acid and peroxide water, forcing specific part of silicon nitride on the electrodes 207, 209 and diffusion layer 223. Next, the relatively high resistive silcides are changed in composition or "transformed" into low resistive silicides 225, by execution of a second-step annealing process at 850° C. for 30 seconds. The resulting structure is depicted in FIG. 6.

Further, several additive components including well-known interlayer dielectric films and upper-layer lead patterns are formed overlying the electrodes 207, 209 to thereby complete an intended semiconductor integrated circuit (IC) comprised of MOS transistors.

As semiconductor ICs increase in integration density and in operating speed, it becomes inevitable to develop semiconductor ICs offering some structural features of a decreased distance between adjacent gate electrodes and less difflision-layer capacitance. Also, as the demands for achievement of further increased circuit operation speed are becoming more strict in the recent years, the salicide technology for fabrication of low resistive silcides near electrdes is becoming increasingly important in a wide variety of semiconductor applications. The prior art semiconductor IC structure as discussed previously in conjunction with FIGS. 3–6 is the MOS IC device which applies such salicide process to its stacked MOS transistors satisfying the foregoing technical requirements for formation of low resistive silicides near the electrodes thereof.

It should be noted here that the salicide process is such that titanium is deposited by sputtering techniques for reaction with silicon by annealing, which in turn leads to the risk of occurrence of abnormal silicide growth due to some causes including, but not limited to, a reduction in silicide's homology and a decrease in cohesive resistivity. See FIG. 7, which illustrates, in schematic cross-section, one exemplary semiconductor IC device that has experienced such silicide's abnormal growth.

The distance between one gate electrode 207 and its neighboring gate electrode 209 measures 300 nm, more or less. The sidewall films 219 may approximately be 100 nm in maximal film thickness. Hence, the resulting "gap" space as defined between gate electrodes 207, 209 is about 100 nm. Where a silicide is formed by the salicide process in region of as narrow as 100 nm wide, the resultant silicide being formed on the surface of difflsion layer 223 can grow abnormally, which would result in unintentional downward break-through or "extrusion" of diffusion layer 223 to enter or "invade" its underlying well region 202. In the worst case where silicide film 225 abnormally grows to enter the inside of well region 202 through diffusion 223, then junction leakage can take place between diffusion 223 and well region 202, which in turn behaves badly to cause operation failure or malfunction of MOS ICs fabricated.

A technique for avoiding such abnormal silicide growth is to increase the distance between the gate electrodes 207, 209 up to 600 nm or more; unfortunately, this does not come without accompanying a serious penalty an increase in inherent gate-to-gate distance, which results in an increase in on-chip IC element occupation area per se. Another problem faced with the prior art is that simply increasing the distance between gate electrodes 207, 209 would result in an unwanted increase in inherent diffusion capacitance, which disadvantageously serves to lower the operability of semiconductor ICs.

SUMMARY OF THE INVENTION

It is therefore an object of the present invention to provide an improved structure and manufacturing method of a semiconductor integrated circuit device capable of exhibiting superior junction characteristics while at the same time decreasing the element area and increasing the operation speed even where the salicide technology is applied to an extremely narrowed part of diffusion layer laid between adjacent gate electrodes.

To attain the foregoing object, the present invention disclosed and claimed herein provides a specific semiconductor integrated circuit (IC) device which includes a couple of, first and second, electrode layers formed in a semiconductor substrate, sidewall layers formed on the side walls of these first and second gate electrodes, and one or several high-melting point metal silicide layers as formed overlying the first and second gate electrodes, featured in that the first and second sidewall layers are connected together. Another feature of the IC device lies in that the high-melting point silicide layers were formed with the sidewall layers used as a mask pattern therefor.

The structural features of the instant invention make it possible to successfully eliminate, or at least greatly suppress, occurrence of any abnormal growth of silicides during formation thereof because of the fact that certain part or region of the semiconductor substrate is covered by the first and second sidewalls.

In accordance with a further aspect of the invention, a semiconductor IC device includes an impurity-doped layer formed in a semiconductor substrate, first and second electrode layers formed on the semiconductor substrate, a high-melting point metal layer formed in the impurity layer overlying the first and second electrode layers, and sidewall layers formed on the side walls of the first and second electrode layers, featured in that the first electrode layer is spaced apart from the second electrode layer by a specifically selected distance which may be less than or substantially equal to 200 nm. Alternatively, the distance between the first and second electrode layers is substantially less than the width of each of the first and second electrode layers.

With such second structural feature of the invention also, the risk of abnormal silicide growth beneath the region defined between the first and second gate electrodes may be avoidable because of the capability of forcing the first sidewall layer to be connected or coupled to the second sidewall layer due to a substantive decrease in distance between the first and second gate electrodes down to 200 nm or less. Additionally, the operation speed of the IC device may also be enhanced due to a decrease in diffusion capacitance as originated from the fact that the distance between the first and second gate electrodes remains less than before.

Other objects, features, and advantages of the present invention will become apparent from the following detailed description. It should be understood, however, that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

A more complete appreciation of the present invention and many of its attendant advantages will be readily obtained by reference to the following detailed description considered in connection with the accompanying drawings, which.

DETAILED DESCRIPTION OF PREFERRED EMBODIMENTS

Some embodiments of the present invention will be described with reference to FIGS. 8–19 in the figures of the accompanying drawing.

Figure 1:
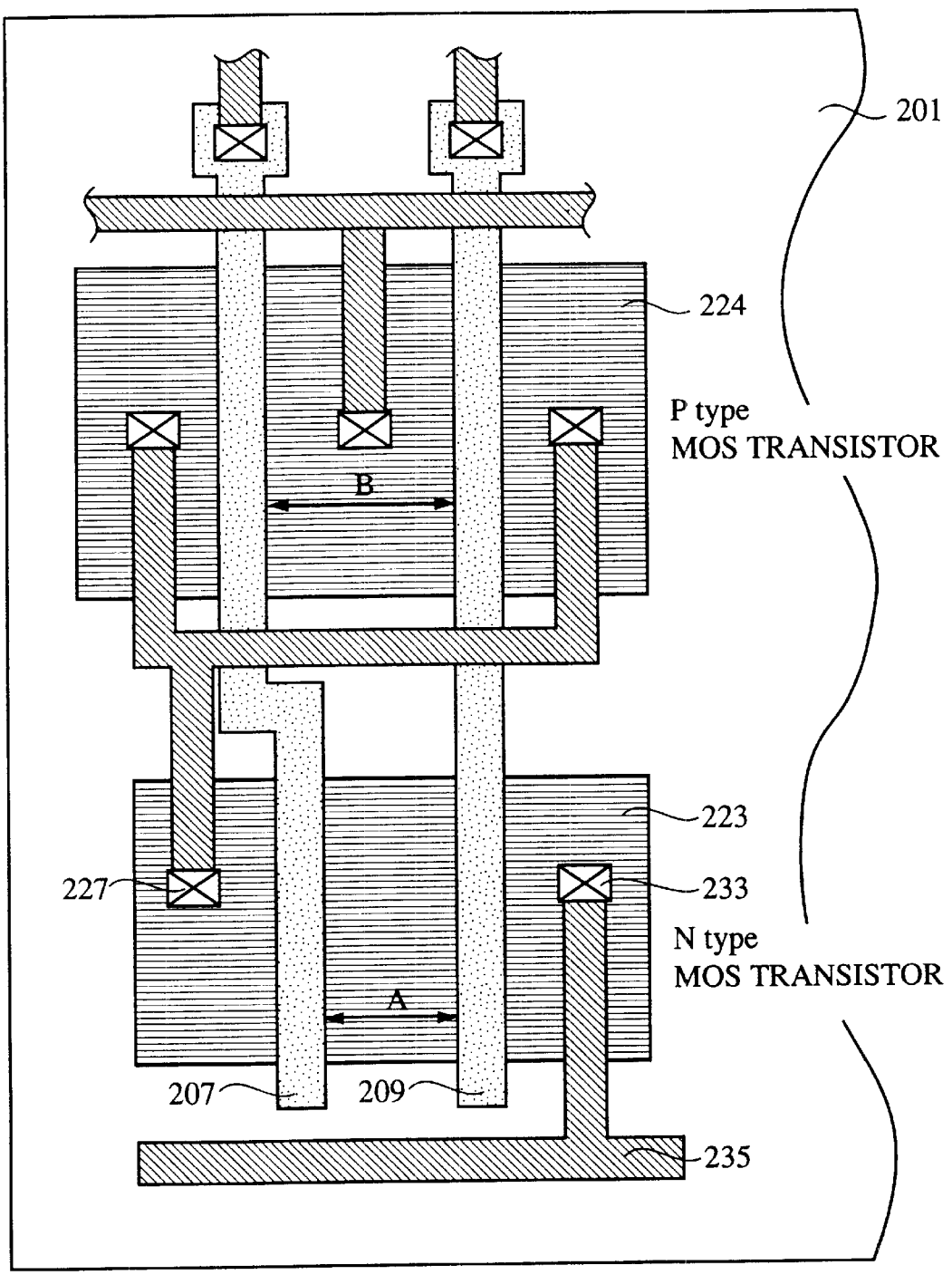
FIG. 1 is a diagram showing a plan view of one typical prior art semiconductor IC device.
Figure 2:
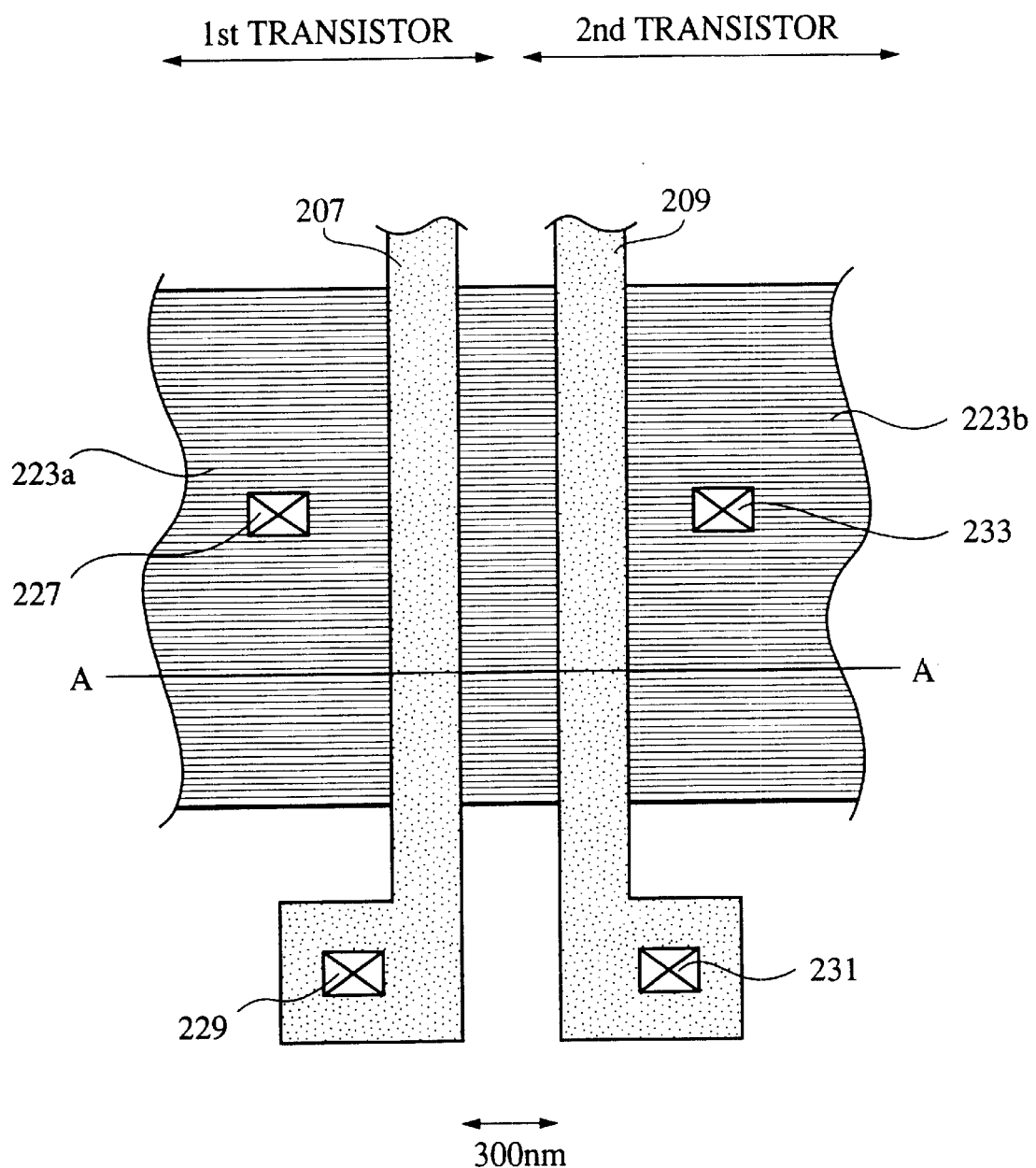
FIG. 2 shows an enlarged plan view of part of the IC device shown in FIG. 1.
Figure 3:
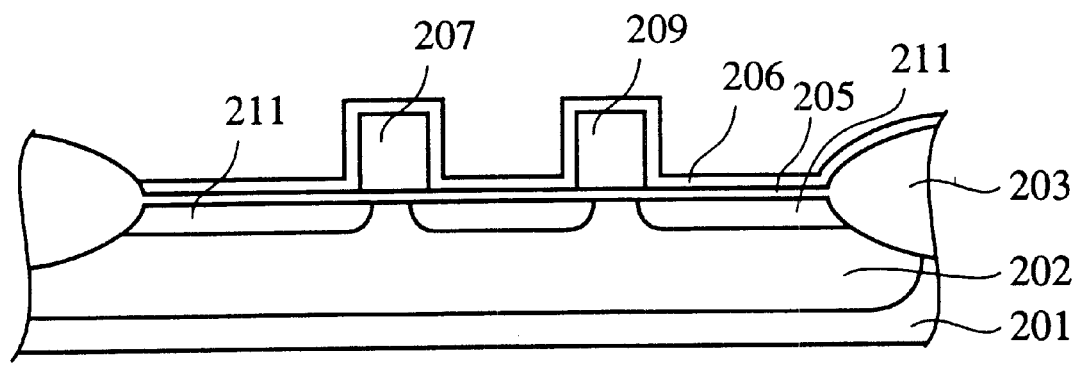
FIGS. 3 through 6 illustrate, in schematic cross-section, some of the major steps in the manufacture of the device shown in FIG. 1.
Figure 4:
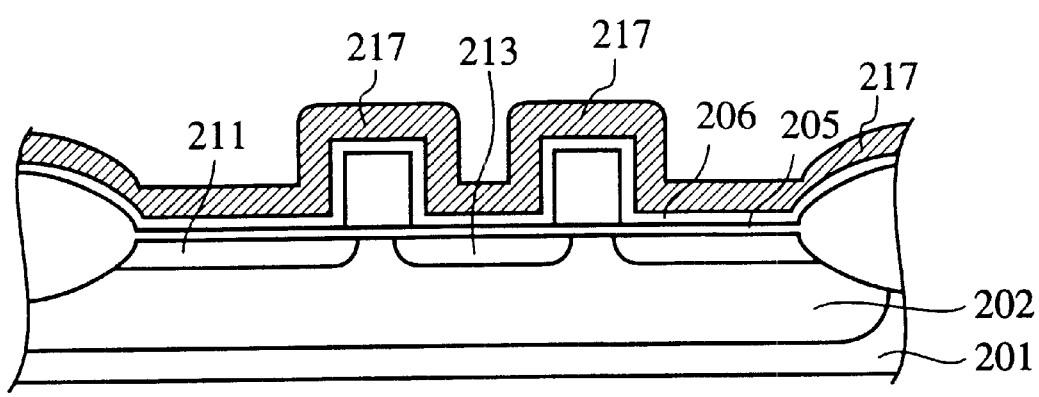
Figure 5:
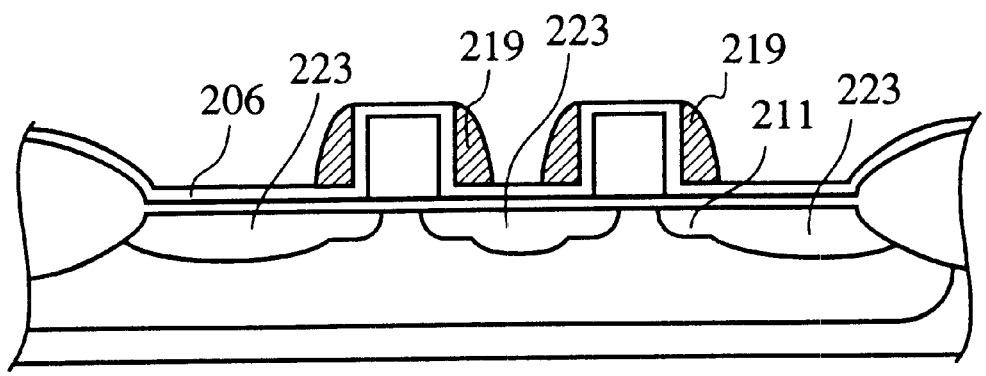
Figure 6:
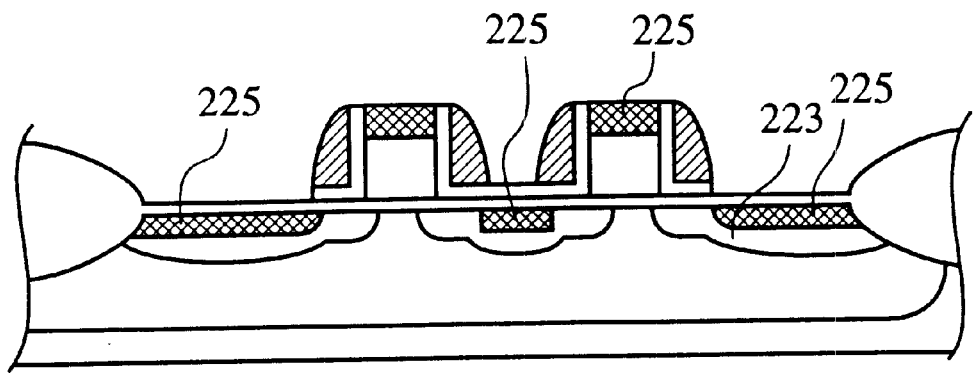
Figure 7:
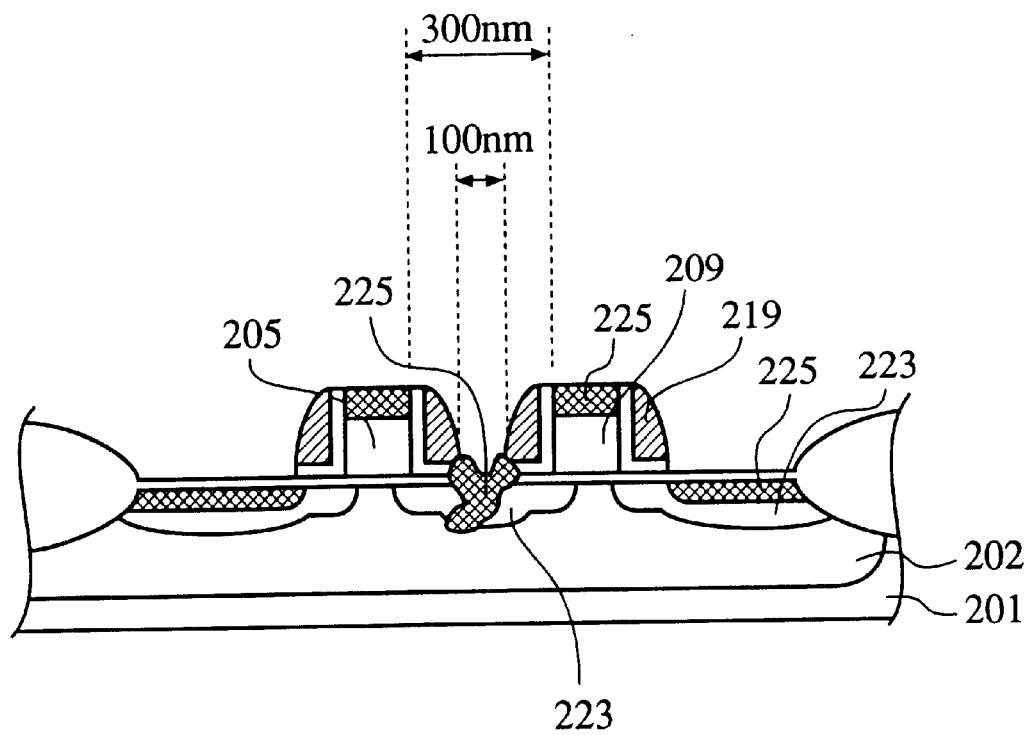
FIG. 7 shows a cross-sectional view of one exemplary semiconductor IC device having an abnormal growth of silicide therein.
Figure 8:
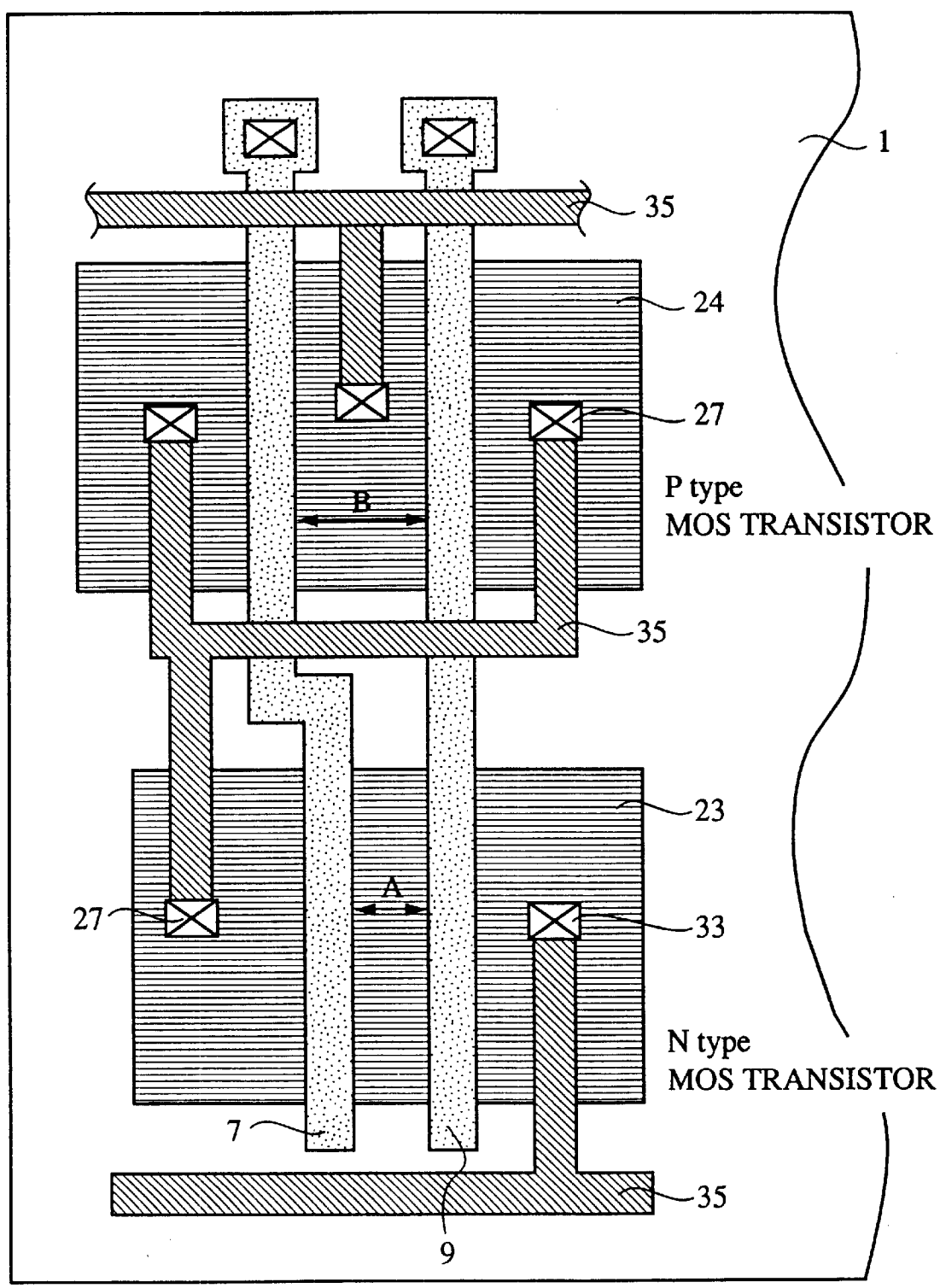
FIG. 8 is a diagrammatic representation of a plan view of a semiconductor IC device in accordance with one preferred embodiment of the invention.
Figure 9:
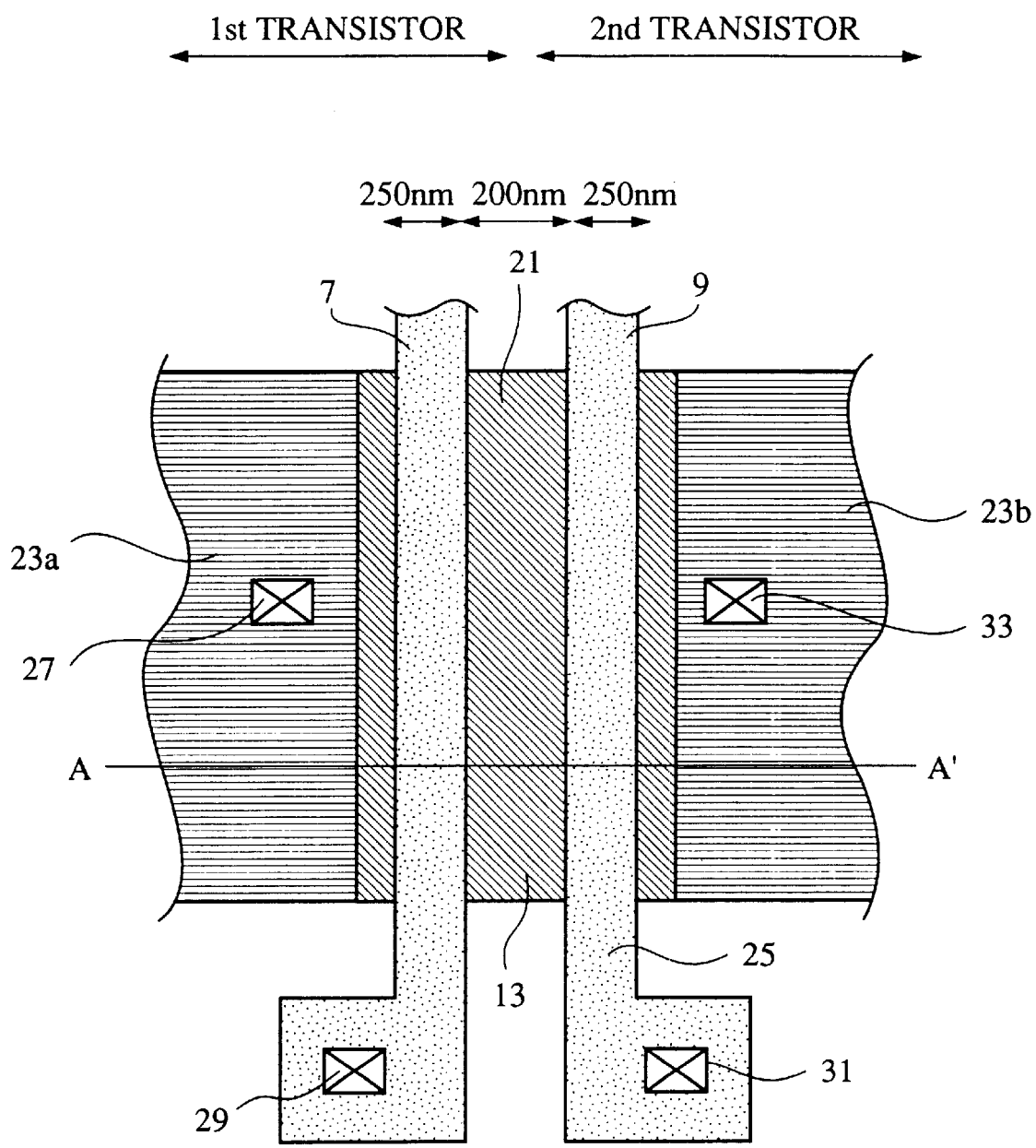
FIG. 9 shows an enlarged plan view of certain part of the IC device of FIG. 8.

FIG. 8 shows a plan view of a semiconductor integrated circuit (C) device in accordance with one preferred embodiment of the invention, FIG. 9 is a pictorial representation of part of the FIG. 8 device. Also, FIGS. 10–18 illustrate typical device structures obtainable at major steps in the manufacture of the IC devices for explanation of fabrication methodology also embodying the invention.

Referring first to FIG. 8, a NAND IC chip is configured from p-type metal oxide semiconductor (pMOS) and n-type MOS (nMOS) transistors on a semiconductor substrate 1 made typically of silicon as can be seen from the planar surface thereof. The silicon substrate 1 has in its top surface a p-type diffusion layer 24 and n-type diffusion layer 23 with gate electrode lines 7 and 9 being formed to overlie diffusion layers 23 and 24. These layers have thereon several electrode contact portions 27, selected ones of which are electrically connected together by a corresponding one of metal lead patterns 35. Due to the inherent IC configuration, the distance between adjacent gate electrodes of nMOS transistors with a reference character "A" adhered thereto is narrowed in a way such that it is less than the distance "B" between the gate electrodes of pMOS transistors. The former gate-to-gate distance "A" may typically be 200 nm.

As is shown in FIG. 9, this depicts a planar structure of one nMOS transistor which is part of the NAND circuit consisting essentially of two MOS transistors, wherein two gate electrodes are formed above an associative diffusion layer.

One example is that n-type difflusion layers 23 and 13 are formed in a p-type well region in substrate 1 while two parallel elongated gate electrodes 7, 9 are formed overlying n-type diffusion layers 23, 13. One significant feature of this MOS transistor is that silicide films (19, 21 in FIG. 13) are formed (at certain positions overlying diffusion layer 23 and electrodes 7, 9) above the diffusion layer 23 and also on the gate electrode 7 and gate electrode 9, for decreasing electrode resistivity, while sidewall films (not shown herein) of gate electrodes 7, 9 are formed covering the diffusion layer 13 (at a location overlying diffusion 13). Very importantly, due to formation of such silicide films (not shown but at certain positions overlying diffusion layer 23 and electrodes 7, 9) with sidewall films 19, 21 used as a mask pattern therefor, the diffusion layer 13 has no silicides formed therein. In addition, the gate electrodes 7, 9 are formed so that these are in parallel to each other with a specific distance of 200 nanometers (nm) defined therebetween.

This NAND circuit is rendered operative (generating its drain current) upon application of voltage to both the electrode 29 and electrode 31 (gate electrode 7 and gate electrode 9). In this case a diffusion layer 23a may function as the source region, diffusion layer 13 serves as the drain region, and gate electrode 7 acts as the gate, thus constituting a first transistor which may generate a drain current flowing from the source to the drain region thereof. For a second transistor, the diffusion layer 13 acts as its source region, diffusion layer 23b as drain, and gate electrode 9 as gate to constitute the second transistor which generates its drain current flowing from the source to the drain region. Looking at the electrode 27 and electrode 33, current is derived from electrode 27 to electrode 33 causing an nMOS transistor to operate, which is also part of the NAND circuit consisting essentially of the first and second transistors.

A manufacturing method of the nMOS transistor of FIG. 9 will be described in conjunction with FIGS. 10–14, which illustrate, in schematic cross-section taken along line A–A', some of the major steps thereof on a time sequential basis.

Figure 10:
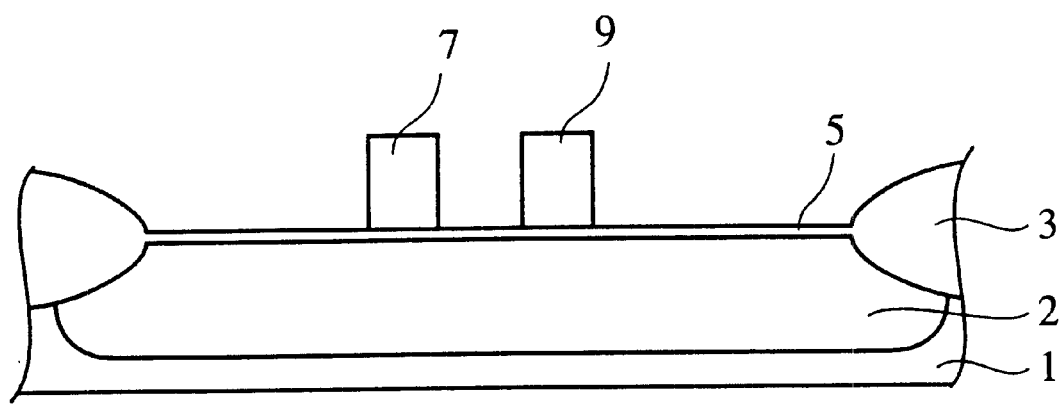
FIGS. 10 to 14 illustrate, in schematic cross-section, some of the major steps in the manufacture of the IC device embodying the invention.

First, as shown in FIG. 10, the silicon substrate 1 is doped by ion implantation techniques with a p-type impurity to a predetermined concentration of $4 \times 10^{16}$ atoms per cubic centimeter (4E16 cm$^{-3}$), forming in substrate 1 a well region 2 of p-type conductivity. Then, an element separation region 3 of a predefined pattern is formed by selective oxidation techniques on the top surface of substrate 1; further, a gate oxide thin-film 5 is formed by thermal oxidation on p-well region 2 to a thickness of for example, 6 nm. Next, a non-doped polysilicon layer with no impurities contained therein is formed by chemical vapor deposition (CVD) techniques on the substrate surface to a thickness of approximately 200 nm. Thereafter, the resulting structure is subject to a photoetching process for removing away the polysilicon layer to thereby form two spaced-apart electrodes 7, 9 on the substrate surface as shown in FIG. 10. Note here that the distance between electrodes 7, 9 may typically be 200 nm, or more or less.

Figure 11:
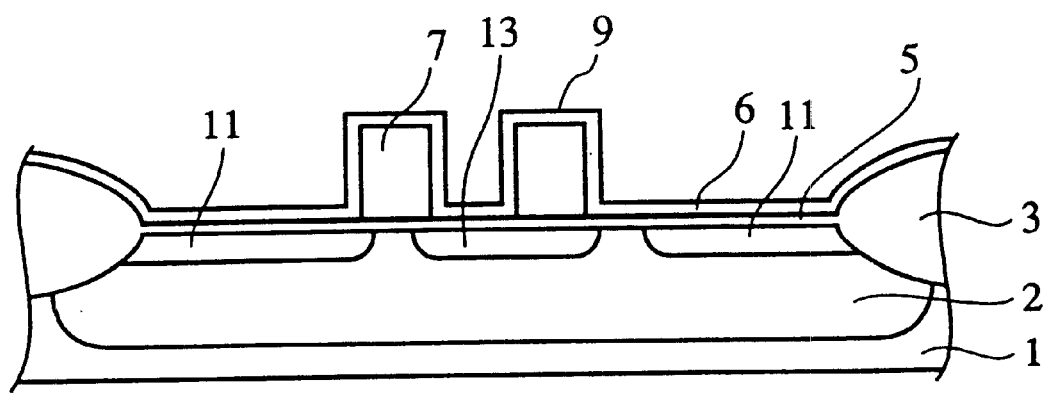

Then, as shown in FIG. 11, an oxide film 6 of approximately 20 nm thick is entirely deposited by CVD techniques covering the gate oxide film 5 and electrodes 7, 9. Next, the p-well region 2 is doped by ion implantation with a chosen impurity such as arsenide (As) through oxide film 6 at a dose of $3\times10^{14}$ cm$^{-2}$ (3E14 l/cm$^2$) upon application of an acceleration voltage of 60 kilo-electronvolts keV), and is then thermally annealed for activation of the doped impurity at 950° C. for about 30 seconds, thereby forming "shallow" diffusion layers 11, 13 (the depth from the substrate surface may typically be 80 (nm) with the extension structure having a sheet resistance of 250 ($\Omega/\square$) or therearound. It must be noted that in the prior art MOS transistors with a lightly doped drain (LDD) structure, the LDD region thereof has a lower impurity concentration than 5E18/cm$^3$, which may be equivalent to a lightly doped region as compared to the extension structure of the IC device structure embodying the invention as shown in FIG. 11.

Figure 12:
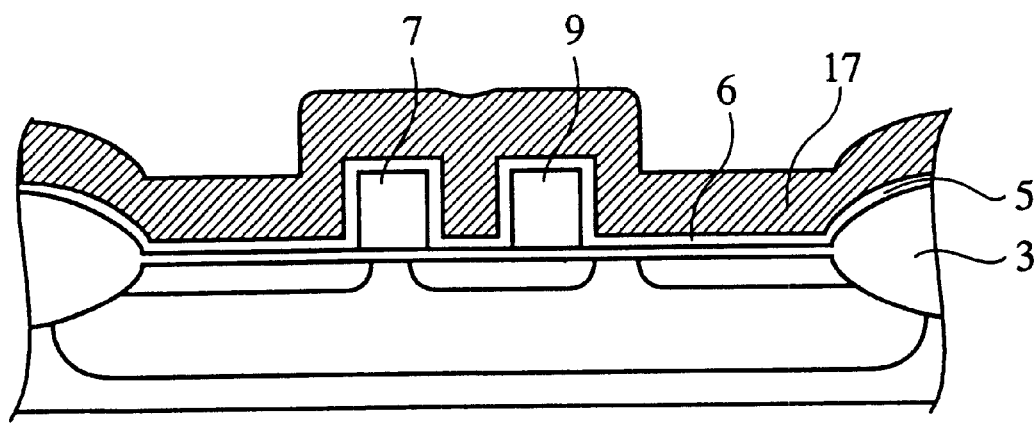

At the process step shown in FIG. 12, a silicon nitride film 17 is deposited by GVD method to a thickness of 100 nm so as to cover the entire surface of the structure. At this time any residual space or "gap" between electrodes 7, 9 is almost completely, buried in film 17 due to the fact that the distance therebetween is at 200 nm, or more or less.

Figure 13:
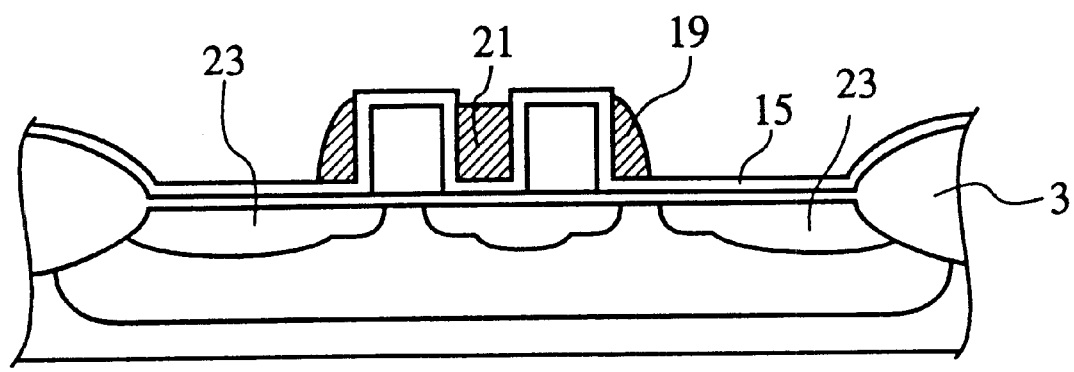

At the step shown in FIG. 13, the silicon nitride 17 is subjected to an anisotropic etching process, such as reactive ion etching (RIE), with the oxide film 6 used as a stopper to thereby remove away its entire upper part of 100 nm thick for exposure of the underlying oxide film 6. At this time those portions of silicon nitride deposited on the side walls of the electrodes 7, 9 continue to reside thereon after completion of suc entire-surface anisotropic etching thereby forming sidewall films 19 having a maximum film thickness, in a horizontal direction, of approximately 100 nm on respective "outer" electrode walls. A silicon nitride film 21 is also formed on part of the substrate surface laid between electrodes 7, 9—namely, the gap space therebetween— allowing the "inner" opposite electrode sidewalls to be connected together. Next, with the outer sidewall films 19 and the silicon film 21 that lies midway therebetween being used as a mask pattern, the p-well region 2 is ion-implanted with a chosen impurity such as As to a dose of 5E15 (l/cm$^2$) while applying thereto an acceleration voltage of 65 keV, and is then thermally annealed for activation of dopant at 1050° C. for 10 seconds to thereby form "deep" diffusion layers 23 at selected locations in the surface of p-well region 2, wherein the deep layers 23 may be 150 nm in depth from the top substrate surface and 60 ($\Omega/\square$) in sheet resistance, as shown in FIG. 13.

Figure 14:
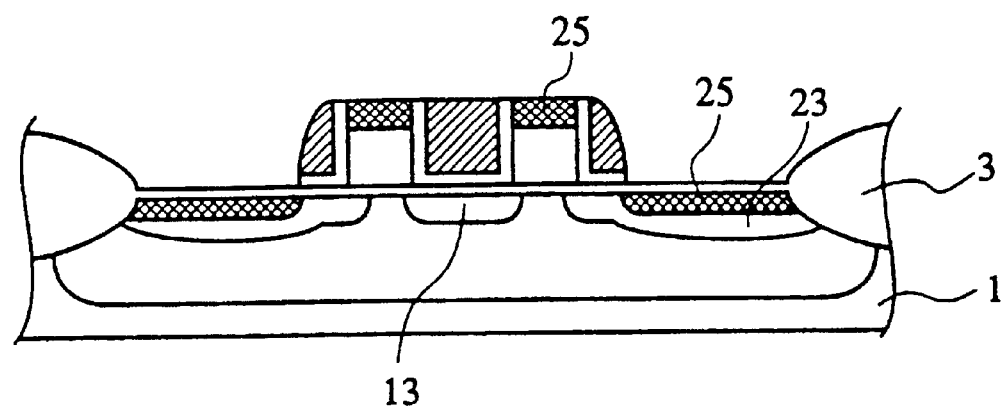

Here, to decrease the surface resistivity of the electrodes 7, 9 and deep diffusion layer 23 to increase the operating speed of the illustrative MOS IC device, one or more low-resistance silicides are formed near the electrodes by the salicide fabrication technique. The salicide process is as follows. First, the oxide film 6 is removed using hydrofluoric acid solution with sidewall films 19 and silicon nitride film 21 used as a mask, exposing electrodes 7, 9 and diffusion layer 23 to expose. Then, titanium is entirely deposited by sputtering on the entire exposed surface to a thickness of; for example, 30 nm for formation of a relatively high resistive silicide by a first-step annealing process at 750° C. or about 30 seconds. During this process the titanium attempts to exhibit silicide reaction only with silicon residing in such exposed region while allowing titaniumn the other part thereof to be kept chemically unread Then, such unreacted titanium is selectively removed using a 1:1 mixed solution of suifiic acid and peroxide water, letting specific portions of titanium on the electrodes 7, 9 and diffusion layer 23. Next, the relatively high resistive silicides are changed in composition or "transformed" into low resistive silicides 25, by execution of a second-step annealing process at 850° C. for 30 seconds, as shown in FIG. 14. Very importantly, no silcides are formed on diffusion layer 13 due to the presence of the silicon nitride film 21 covering diffusion layer 13 for protection as readily seen from FIG. 14.

Thereafter, several necessary parts or components including, but not limited to, interlayer dielectric films and upper lead patterns are formed insulatively overlying the gate electrodes 7, 9 to thereby complete the intended MOSIC device.

One significant advantage of the: illustrative semiconductor IC device incorporating the principles of the invention lies. in capability of eliminating, or at least greatly suppressing, any junction current leakage otherwise occurring due to the instability during formation of the silicide(s) on the silicon substrate of limited area. This can be said because no silicides are present in the diffusion layer 13. Another advantage of the embodiment is that the IC device is capable of offering increased operation speed because of a decrease in inherent diffusion capacitance as the distance between adjacent gate electrodes 7, 9 decreases.

It should be noted in this embodiment that while no impurity ions are implanted into the diffusion layer 13 because of presence of its overlying silicon nitride gate gap film 21, any degradation of the characteristics during oration of circuit elements may be eliminated This is because of the fact that the shallow difflision layer 25 with the extension structure, which measures 250 ($\Omega/\square$) in sheet resistance and 80 nm in depth from the substrate surface, was formed sufficiently reducing the electrical resistivity of diffusion layer 13. Optionally, in the case of pMOS transistors rather than nMOS transistors, the same may be attainable by formation of a corresponding extension structure of p-type conductivity with its sheet resistance of approximately 2000 ($\Omega/\square$).

It would be readily understandable by those skilled in the semiconductor art that the high-melting point metal as used in the illustrative embodiment may be replaced with any other equivalent material including, but not limited to, cobalt, nickel, platinum, or palladium.

It would also be seen by these skilled in the art that the foregoing device structure embodying the invention should not exclusively be limited to the NAND circuit and may also be applicable to any currently available fundamental or basic circuitry as comprised of MOS transistors.

Figure 15:
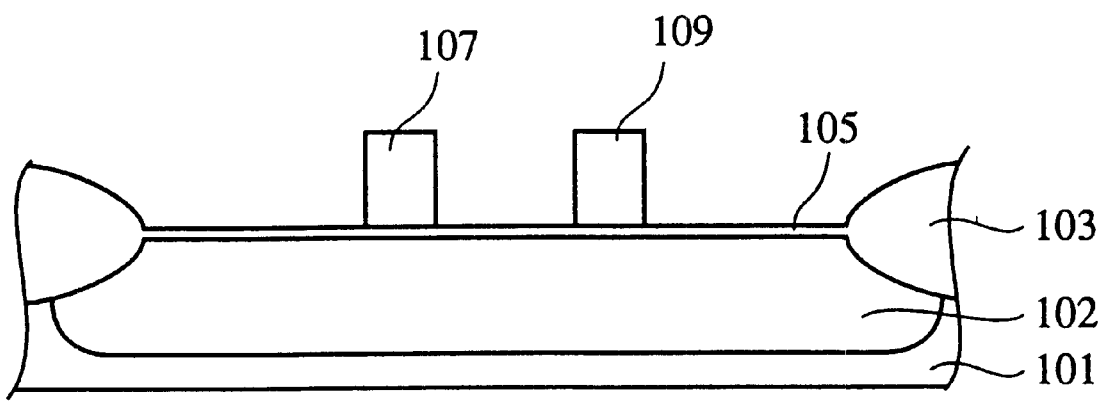
FIGS. 15–19 depict in schematic cross-section some of the major steps in the manufacture of a semiconductor IC device for explanation of a manufacturing method in accordance with another embodiment of the invention.

A process for forming a semiconductor IC device in accordance with another embodiment of the invention will now be described in conjunction with FIGS. 15–19, which depict in similar cross-section some of the major steps in the manufacture thereof First referring to FIG. 15, a silicon substrate 101 is doped by ion implantation with a p-type impurity to a concentration of 4E16 cm$^{-3}$, forming therein a well region 102 of p-type conductivity. A selective oxidation process, is performed forming an element separation region 103 in selected areas on the entire top surface of substrate 101; then, a gate oxide film 105 of typically 6 nm thick is formed by thermal oxidation techniques on p-well region 102. Next, a non-doped polysilicon layer having a thickness of, for example, 200 nm is formed by CVD method on the entire top surface of silicon substrate 101. The resulting structure is subject to photoetching for etching the polysilicon layer to thereby form spaced-apart parallel linear electrodes 107, 109 on the substrate surface, which electrodes insulatively overlie the P-well region 102. The distance between electrodes 107, 109 may be 300 nm.

Figure 16:
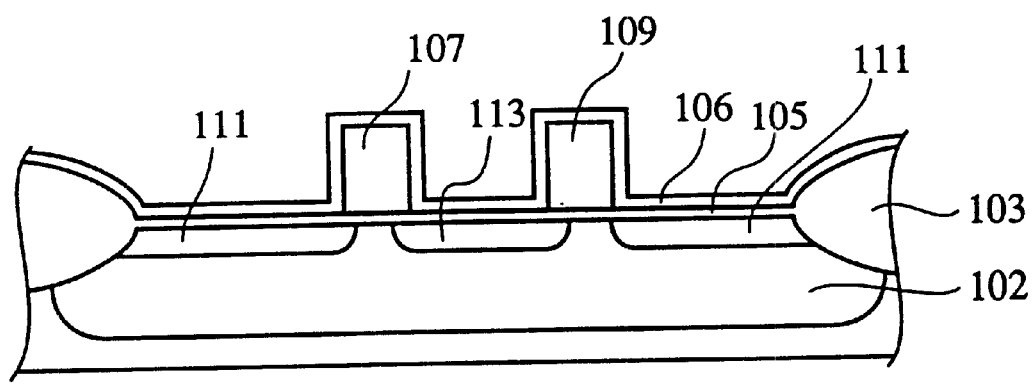

Then, as shown in FIG. 16, an oxide film 106 is deposited by low pressure CVD (LPCVD) techniques on the gate oxide film 105 and electrodes 109, 107, to a predetermined thickness of approximately 20 nm. The p-well region 102 is then doped by ion implantation with a chosen impurity such as As through oxide film 106 at a dose of 3E14 (1cm$^2$) upon application of an acceleration voltage of 60 keV, and is then thermally annealed for activation of doped impurity at 950° C. for about 30 seconds, thereby forming a couple of shallow diffusion layers 111, 113 with the extension structure having a sheet resistance of approximately 250 ($\Omega/\square$) (the depth from the substrate surface may be 80 nm), as shown in FIG. 16. These shallow diffusions 111, 113 may substantially be self-aligned with gate electrodes 107, 109.

Figure 17:
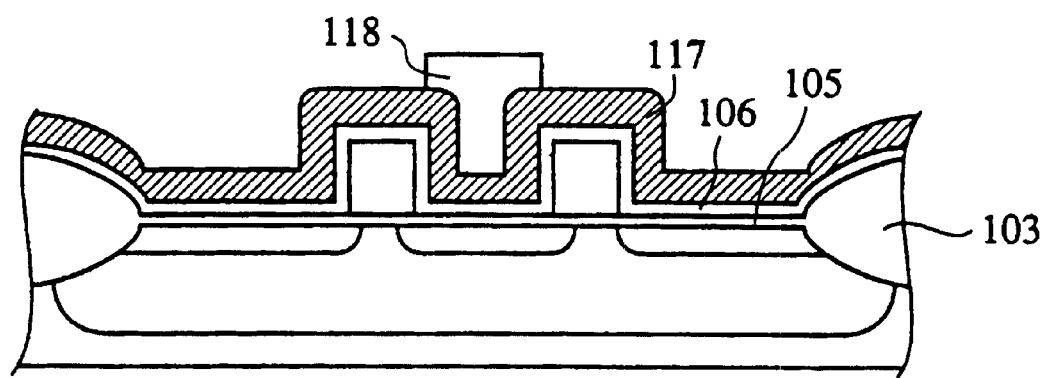

Next, as shown in FIG. 17, a silicon nitride film 117 is entirely deposited by LPCVD on the resultant structure to a thickness of; for example ,100 nm At this time a "gap" space between electrodes 107, 109 is not fully buried in silicon nitride film 117; more specifically, part of film 117 deposited in such space has a concave portion or "trench"; between electrodes 107, 109. This occurs because the distance therebetween is as wide as 300 nm relative to the thickness of silicon nitride film 117, i.e. 100 nm. A patterned photoresist film. 118 is then formed on film 117 filing the trench thereof between electrodes 107, 109 so that the photoresist film 118 has a T-shaped cross-section area causing,2 electrodes 107, 109 to be coupled together as shown in FIG. 17.

Figure 18:
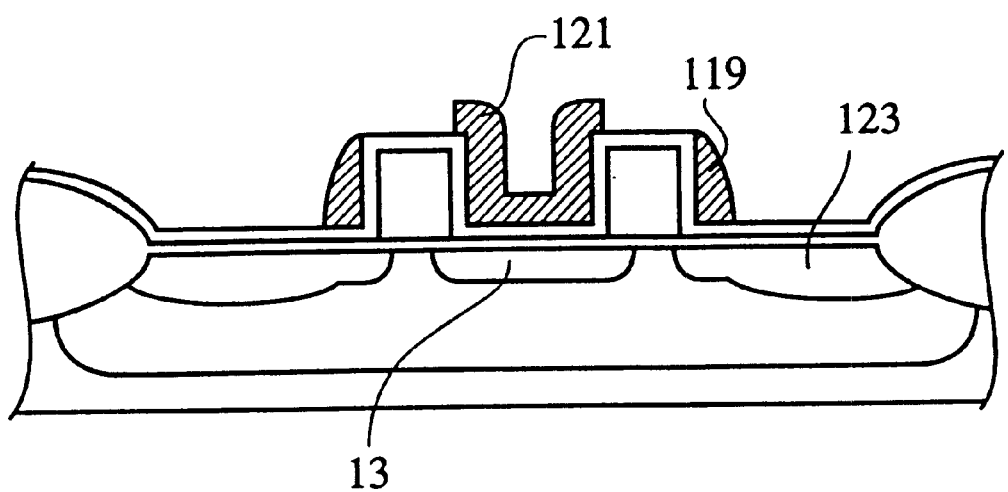

The resultant structure is next subject to an anisotropic etching treatment with the T-shaped photoresist film 118 used as a mask and with oxide film 106 as a stopper, thereby removing away the entire upper part of silicon nitride film 117 which may be 100 nm in thickness. When this is done, certain portions of film 117 which reside on the inner and outer side walls of electrodes 107, 109 are left even after completion of the entire-surface anisotropic etching process, thus forming a "U" like silicon nitride portion 121 between the inner side walls of electrodes 107, 109 as well as sidewall portions 119 on the outer side walls thereof as shown in FIG. 18. The maximal thickness of such silicon nitride sidewall films 119, 121 may be 100 nm, more or less. After the photoresist film 118 is removed away, the sidewall films 119 and U-like film 121 are used as a mask pattern for again doping a chosen impurity such as As into the p-well region 102 by ion implantation at an acceleration voltage of 65 keV and a dose of 5E15 (1/cm$^2$); then, the resultant structure is thermally annealed for activation of dopant at 1050° C. for 10 seconds, thus forming deep diffusion layers 123 as shown in FIG. 18. This layer may typically be 150 nm in depth from the substrate surface and 60($\Omega/\square$) in sheet resistance.

Figure 19:
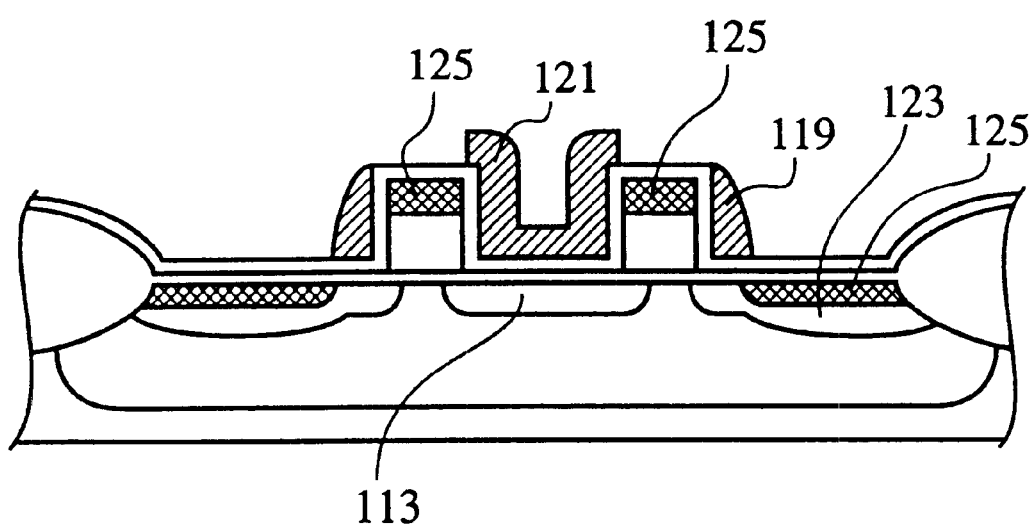

Here, for reducing the surface resistivity of the gate electrodes 107, 109 and diffusion layer 123 to speed up the operation of MOS IC device, a need: arises to form by the salicide process more than one low-resistance silicide near the electrodes. The salicide process is as follows. First, with the silicon nitride sidewall films 119 and U-shaped sidewall film 121 used as a mask, the oxide film 106 is partly removed using hydrofluoric acid solution for exposure of the electrodes 107, 109 and diffuision 123. Then, titanium is entirely deposited by sputtering techniques on the resultant exposed surface to a thickness of 30 nm for example, for formation of relatively high resistive silicides by a first-step annealing process at 750° C. for 30 seconds. During this process the titanium performs silicide reaction only with silicon in such exposed region while permitting titanium in the other part thereof to be kept unreacted. Then, the unreacted titanium is selectively removed using a 1:1 mixed solution of sulfur acid and peroxide water, forcing titanium to be left on the electrodes 107, 109 and diffusion layer 123 only. Next, the relatively high resistive silicides are transformed into low resistive silicides 125, by execution of a second-step anneal treatment at 850° C. for 30 seconds. When this is done, no silicides are formed on diffiision layer 113 due to the presence of U-like silicon nitride film 121 covering diffusion 113. The resulting structure is shown in FIG. 19.

Further, several known IC components including but not limited to interlayer dielectric films and upper-layer lead lines are formed thus completing the MOS IC device.

A significant advantage of this embodiment also embodying the invention lies in it's capability of eliminating, or at least greatly suppressing, generation of a junction leak current otherwise occur due to the instability during formation of silicides on the silicon substrate of limited area. This can be said because no silicides are present in diffusion layer 113.

Another advantage is its capability of eliminating, or at least greatly suppressing any degradation of characteristics including operability of circuit elements because of the fact that, while the ion implantation into the diffusion layer 113 remains undone due to presence of the U-like silicon nitride film 121 linking together the inner side walls of gate electrodes 107, 109, the electric resistivity is still lowered sufficiently by formation of the shallow diffusions with the extension structure which may be 250 ($\Omega/\square$) in sheet resistance and 80 nm in depth from the top substrate surface. Additionally, in the case of pMOS transistors rather than nMOS transistors, the shallow diffusions may be replaced by those with the extension structure of p-type conductivity which may measure 2000 ($\Omega/\square$) in sheet resistance.

It would be readily appreciated to a skilled person in the semiconductor art that the high-melting point metal as used in the embodiment may be replaced with any other equivalent material including, but not limited to, cobalt, nickel platinum, or palladium.

It would also be seen one skilled in the art that the foregoing device structure of the invention should not exclusively be limited to the NAND circuit and may also be applicable to any currently available basic MOS transistor circuitry.

It has been described that according to the principles of the invention with the foregoing configuration, abnormal growth during silicide formation may be prevented due to the fact that a specific part or region of the top substrate surface laid between the first and second electrodes is covered by the sidewall layer of first electrode layer and that of the second one.

It is also possible to eliminate or suppress degradation of characterics such as operability of circuit elements because of the fact that the diffusion layer in a region between the first and second electrodes remains sufficiently. low in electrical resistivity due to formation of at least one shallow diffiision layer of the extension structure. This may in turn lead to attainability of semiconductor MOS IC devices with enhanced operation speed.

While there has been illustrated and described what are presently considered to be preferred embodiments of the present invention, it will be understood by those skilled in the art that various changes and modifications may be made, and equivalents may be substituted for devices thereof without departing from the true scope of the invention. In addition, many modifications may be made to adapt a particular situation or material to the teaching of the present invention without departing from the central scope thereof. Therefore, it is intended that this invention not be limited to the particular embodiment diclosed as the best mode contemplated for carrying out this invention, but that the invention include all embodiments falling within the scope of the appended claims.

What is claimed is:

1. A method for manufacturing a semiconductor integrated circuit device comprising:

forming a first oxide film on a top surface of a semiconductor substrate;

forming a first electrode, having a first sidewall and a second sidewall, on the first oxide film;

forming a second electrode on the first oxide film, wherein the second electrode has a first sidewall and a second sidewall, and wherein the first sidewall of the second electrode faces the second sidewall of the first electrode;

forming a first diffusion region within the substrate in an area adjacent to the first sidewall of the first electrode;

forming a second diffusion region within the substrate in an area between the second sidewall of the first electrode and the first sidewall of the second electrode;

forming a third diffusion region within the substrate in an area adjacent to the second sidewall of the second electrode;

forming a first silicide within the first diffusion region and beneath the top surface of the substrate; and forming a second silicide within the third diffusion region and beneath the top surface of the substrate, wherein the second diffusion region includes no silicides formed therewithin.

2. The method of claim 1, further comprising:

forming a second oxide film on the second sidewall of the first electrode, on the first oxide film located above the second diffusion region, and on the first sidewall of the second electrode; and forming a silicon nitride film that substantial fills a volume between the second sidewall of the first electrode and the first sidewall of the second electrode and resides on the second oxide film.

3. The method of claim 1, wherein the first electrode is spaced apart from the second electrode by a distance of less than or substantially equal to 200 nm.

4. The method of claim 1, further comprising:

forming a first sidewall layer on the first sidewall of the first electrode, and forming a second sidewall layer on the second sidewall of the second electrode, wherein a maximum film thickness, in a horizontal direction, of each of the first sidewall layer and the second sidewall layer is less than or equal to approximately 100 nm.

5. The method of claim 1, wherein the semiconductor integrated circuit device comprises a p-type metal oxide semiconductor (MOS) transistor and an n-type MOS transistor.

6. The method of claim 1, wherein the first, second, and third diffusion regions have sheet resistances of approximately 250 Ω/□.

7. The method of claim 1, further comprising:

forming a first deep diffusion region located in the area of the first diffusion region and extending to a depth greater than a depth of the first diffusion region; and forming a second deep diffusion region located in the area of the third diffusion region and extending to a depth greater than a depth of the third diffusion region.

8. The method of claim 7, wherein the first and second deep diffusion regions have sheet resistances of approximately 60 Ω/□.

9. The device of claim 7, wherein the first, second, and third regions have depths of approximately 80 nm below the top surface of the substrate, and wherein the first and second deep diffusion regions have depths of approximately 150 nm below the top surface of the substrate.

10. A method for manufacturing a semiconductor integrated circuit device comprising:

forming a first oxide film on a top surface of a semiconductor substrate;

forming a first electrode, having a first sidewall and a second sidewall, on the first oxide film;

forming a first sidewall layer on the first sidewall of the first electrode;

forming a second electrode on the first oxide film, wherein the second electrode has a first sidewall and a second sidewall, and wherein the first sidewall of the second electrode faces the second sidewall of the first electrode;

forming a second sidewall layer on the second sidewall of the second electrode, wherein a distance between said first electrode and said second electrode is less than or substantially equal to a maximum film thickness, in a horizontal direction, of the first sidewall layer plus a maximum thickness, in a horizontal direction, of the second sidewall layer;

forming a first diffusion region within the substrate in an area adjacent to the first sidewall of the first electrode;

forming a second diffusion region within the substrate in an area between the second sidewall of the first electrode and the first sidewall of the second electrode;

forming a third diffusion region within the substrate in an area adjacent to the second sidewall of the second electrode;

forming a first silicide within the first diffusion region and beneath the top surface of the substrate; and forming a second silicide within the third diffusion region and beneath the top surface of the substrate, wherein the second diffusion region includes no silicides formed therewithin.

11. The method of claim 10, further comprising:

forming a second oxide film on the second sidewall of the first electrode, on the first oxide film located above the second diffusion region, and on the first sidewall of the second electrode; and forming a silicon nitride film substantially filling a volume between the second sidewall of the first electrode and the first sidewall of the second electrode and residing on the second oxide film.

12. The method of claim 10, wherein the first electrode is spaced apart from the second electrode by a distance of less than or substantially equal to 200 nm.

13. The method of claim 10, wherein the maximum film thickness, in a horizontal direction, of each of the first sidewall layer and the second sidewall layer is less than or equal to approximately 100 nm.

14. The method of claim 10, wherein the semiconductor integrated circuit device comprises a p-type metal oxide semiconductor (MOS) transistor and an n-type MOS transistor.

15. The method of claim 10, further comprising:

forming a first deep diffusion region located in the area of the first diffusion region and extending to a depth greater than a depth of the first diffusion region; and forming a second deep diffusion region located in the area of the third diffusion region and extending to a depth greater than a depth of the third diffusion region.

16. The method of claim 15, wherein the first and second deep diffusion regions have sheet resistances of approximately 60 Ω/□.

17. The device of claim 15, wherein the first, second, and third diffusion regions have depths of approximately 80 nm below the top surface of the substrate, and wherein the first and second deep diffusion regions have depths of approximately 150 nm below the top surface of the substrate.

* * * * *